United States Patent [19]

Mair

[11] Patent Number: 5,365,181
[45] Date of Patent: Nov. 15, 1994

[54] FREQUENCY DOUBLER HAVING ADAPTIVE BIASING

[75] Inventor: Hugh Mair, Allen, Tex.

[73] Assignee: Texas Instruments Incorporated, Dallas, Tex.

[21] Appl. No.: 31,753

[22] Filed: Mar. 15, 1993

[51] Int. Cl.⁵ .................. H03K 3/033; H03K 3/78; H03K 21/08
[52] U.S. Cl. ..................... 327/116; 377/45; 377/47; 327/175; 327/227
[58] Field of Search ............... 307/261, 265, 266, 591, 307/595, 597, 271, 273; 328/20; 377/42, 47, 49, 50, 52, 45

[56] References Cited

U.S. PATENT DOCUMENTS 3,569,732  3/1971  Christensen ................. 328/20
4,052,626  10/1977  Tuma et al. .................. 307/271
4,639,679  1/1987  Kasperkovitz et al. ......... 328/20

Primary Examiner—Timothy P. Callahan
Assistant Examiner—Shawn Riley
Attorney, Agent, or Firm—Christopher L. Maginniss; W. James Brady, III; Richard L. Donaldson

[57] ABSTRACT

A frequency doubler having adaptive biasing includes one shot circuits 10 and 12, which are responsive to particular transitions of an input signal for generating pulsed signals at each such transition. The widths of the pulses are determined by the magnitude of a bias current supplied to the one shot circuits. The pulsed signals of one shot circuits 10 and 12 are combined by OR gate 14 to provide an output signal whose frequency is twice the frequency of the input signal. A low-pass filter 16, coupled to the output signal, produces a signal which is a measure of the average voltage level of the output signal. Voltage-to-current converting FET 18, responsive to the average voltage level of the output signal, supplies bias current to one shots 10 and 12. Comparators 20 and 22 detect when the average voltage level is not within a predetermined range, and enable either up or down counting of digital counter 24. The binary-related outputs of counter 24 drive the individual gate electrodes of switching FET's 40 through 48, which provide supplemental bias currents to one shots 10 and 12 corresponding to the count of counter 24. The channel widths of FET's 40 through 48 are scaled in accordance with the binary weighting of their corresponding counter outputs, and the channel of voltage-to-current converting FET 18 is substantially wider than the smallest channel of the switching FET's 40 through 48.

19 Claims, 3 Drawing Sheets

FREQUENCY DOUBLER HAVING ADAPTIVE BIASING

BACKGROUND OF THE INVENTION

The present invention relates generally to electronic circuits and, more particularly, to a frequency doubler which uses adaptive biasing in order to maintain a fixed duty cycle.

A typical frequency doubler for use in high-speed digital applications employs two biased one shot circuits, each one responsive to a particular transition of the input signal to be doubled. The output signals from the two one shots are ORed to provide the frequency doubled signal. The bias current to the one shots controls the widths of their output signal pulses.

In order to provide a fixed duty cycle, desirably fifty percent, over a range of output frequencies, the biasing of the one shot circuits must be able to be dynamically altered. A low-pass filter coupled to the frequency doubled output signal measures its average voltage level, and generates a suitable bias current to the one shot circuits. Thus, as the frequency of the input signal to the doubler increases, the output signal "high" time increases as a percentage of the cycle time. This results in an increase in the voltage level from the low-pass filter, which increases the bias current to the one shot circuits, causing a decrease in their pulse widths until the desired duty cycle is achieved.

The above-described prior art frequency doubler provides satisfactory results within a relatively narrow range of operating conditions. However, for a typical device designed to provide an output signal having a frequency in the range of 100 to 200 MHz, the biasing scheme of the prior art may be inadequate. As an example, a comparison of worst case conditions (maximum frequency, high operating temperature, low supply voltage and minus-three sigma fabrication process variations) with best case conditions (minimum frequency, low operating temperature, high supply voltage and plus-three sigma fabrication process variations) results in a ten-to-one range of bias requirements. Such a range of biasing current cannot be controlled by the frequency doubler biasing scheme of the type described above as prior art.

In view of the foregoing, it is clear that there exists a need to develop an improved apparatus for controlling the bias currents to the one shot circuits of a frequency doubler over what is currently known in the art. Such an apparatus should provide a fixed output signal duty cycle over a wide range of operational, environmental and process variations.

SUMMARY OF THE INVENTION

In accordance with the principles of the present invention, there is disclosed herein apparatus for use with a frequency doubler including means responsive to an input signal for generating an output signal having a single pulse corresponding to each transition of the input signal, wherein the width of the pulse is determined by the magnitude of a bias signal supplied to the generating means, and further including means responsive to the average voltage level of the output signal for supplying the bias signal. The apparatus adaptively supplements the range of the bias signal to the generating means and comprises means for detecting when the average voltage level is outside of a predetermined voltage range, and means responsive to the detecting means for providing additional bias to the generating means.

Further in accordance with the present invention there is disclosed a frequency doubler including a first one shot circuit responsive to a low-to-high transition of an input signal for generating a signal having a single pulse corresponding to each such transition of the input signal, and a second one shot circuit responsive to a high-to-low transition of the input signal for generating a signal having a single pulse corresponding to each such transition of the input signal, wherein the widths of the pulses are determined by the magnitude of a bias current supplied to the first and second one shot circuits. The frequency doubler also includes means for combining the signals generated by the first and second one shot circuits to thereby provide an output signal having frequency which is twice the frequency of the input signal. A low-pass filter is coupled to the output signal for producing a signal which is a measure of the average voltage level of the output signal. The frequency doubler further includes means responsive to the average voltage level of the output signal for supplying the bias current. The frequency doubler additionally includes means for detecting when the average voltage level is not within a predetermined voltage range, and a digital counter responsive to the detecting means for providing output signals representing the count of the counter, the counter signals being in a binary relationship to one another. Finally, the frequency doubler includes means responsive to the binary-related output signals for providing supplemental bias currents to the one shots in proportion to the count of the counter.

BRIEF DESCRIPTION OF THE DRAWINGS

The foregoing features of the present invention may be more fully understood from the following detailed description, read in conjunction with the accompanying drawings, wherein.

DESCRIPTION OF THE PREFERRED EMBODIMENT

Figure 1:
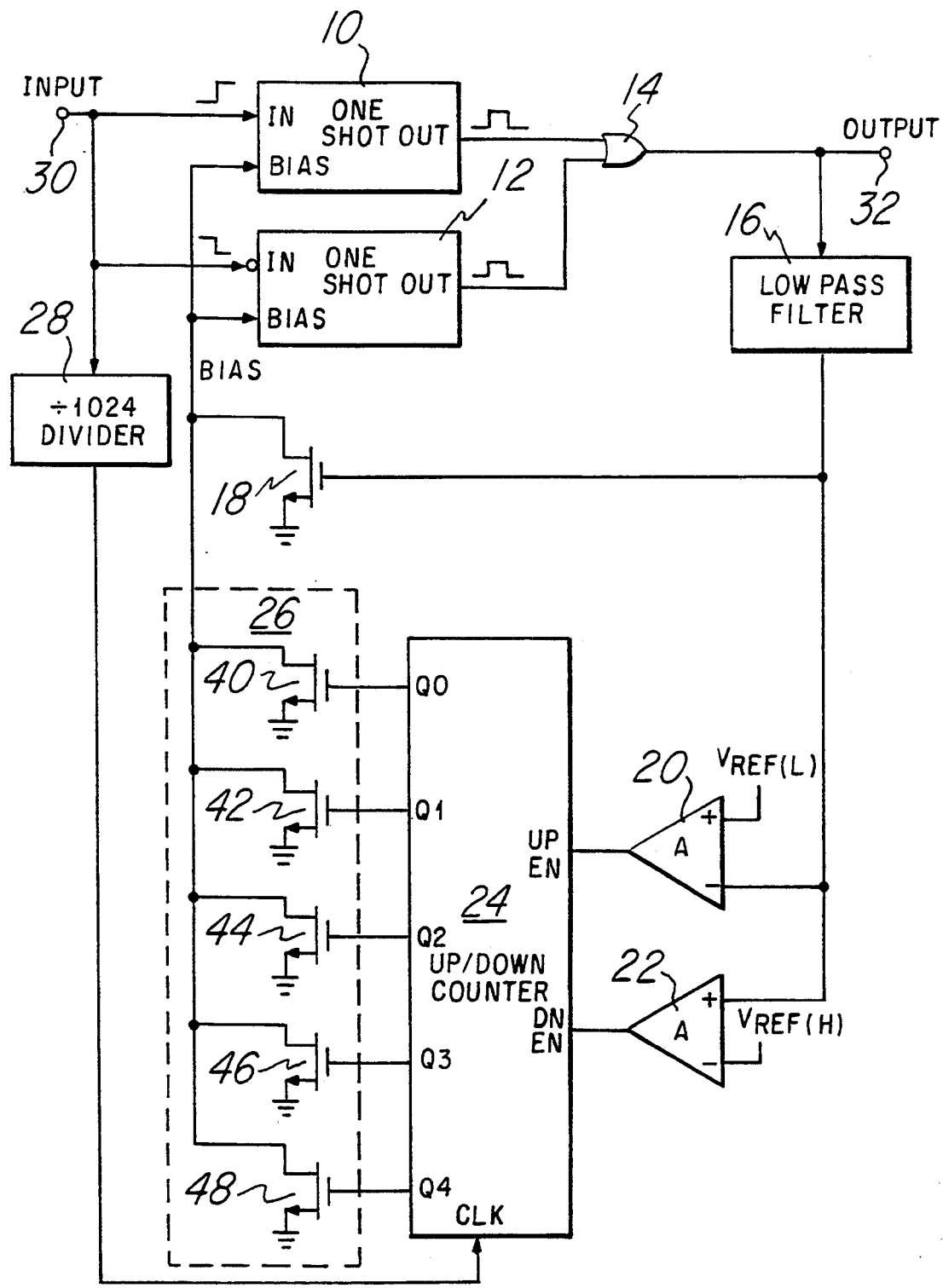
FIG. 1 is a block and schematic diagram of a frequency doubler in accordance with the present invention.

Referring initially to FIG. 1, there is shown a block and schematic diagram of a frequency doubler in accordance with the principles of the present invention. An input signal, which is applied at input node 30, illustratively a square wave signal in the range of 50 to 100 MHz, is coupled to the input terminals of one shot circuits 10 and 12. One shot 10 is responsive to a positive-going edge at its input terminal for producing a positive pulse at its output terminal; one shot 12 is responsive to a negative-going edge at its input terminal for producing a positive pulse at its output terminal. Both one shots 10 and 12 are responsive to the level of current flow at their bias terminals for regulating the widths of their output pulses. An increase in current flow decreases the output pulse width. OR gate 14 combines the output pulses from one shots 10 and 12 to thereby produce at output node 32 the frequency doubled output signal.

The frequency doubled output signal from OR gate 14 is also coupled to the input terminal of low pass filter 16. Filter 16, which, in this example, is a charge pump, provides an output signal whose voltage level represents the average voltage level of the frequency doubled output signal. The output signal from filter 16 is coupled to the gate of transistor 18 which provides voltage-to-current conversion and thereby supplies a dynamically alterable bias current to one shots 10 and 12. In the present example, transistor 18 is an n-channel field effect transistor (FET) which is operated in its analog region. As the frequency of the input signal to the doubler increases, the output signal "high" time increases as a percentage of the cycle time. This results in an increase in the voltage level from low-pass filter 16, which increases the bias current to one shot circuits 10 and 12, causing their pulse widths to decrease until the desired duty cycle is achieved.

The output signal from low pass filter 16 is also coupled to the input terminals of comparators 20 and 22. Comparator 20 compares the output voltage level from filter 16 with a preselected $V_{REF(L)}$ and, if the filter output is less, the output signal from comparator 20 is driven high. Comparator 22 compares the output voltage level from filter 16 with a preselected $V_{REF(H)}$ and, if the filter output is greater, the output signal from comparator 22 is driven high. The output signals from comparators 20 and 22 are coupled as the up-count enable (UP EN) and down-count enable (DN EN) inputs, respectively, to a binary up/down counter 24.

The input signal at input node 30 is coupled as the clock (CLK) input to a divider 28 which, in the present example, divides the frequency of the input signal by 1,024. The divided output signal from divider 28 is coupled as the clock (CLK) input to up/down counter 24. Thus, counter 24 is triggered every 1,024th cycle of the input signal. In the present example, counter 24 comprises five binary stages whose five outputs are denoted Q0, Q1, Q2, Q3, and Q4, in order from least to greatest significance. These five outputs are coupled, respectively, to the gate electrodes of five transistors 40, 42, 44, 46 and 48, comprising a current-mode digital-to-analog converter (DAC) 26.

Each transistor of DAC 26 is coupled between a reference voltage, illustratively digital ground, and the bias current terminals of one shots 10 and 12. In the present example, transistors 40, 42, 44, 46 and 48 are n-channel FET's which are digitally switched to their conducting states by a high logic level at their gate electrodes. Thus, as counter 24 is triggered up and down through all of the states of its binary combinations, its Q outputs enable conduction of bias current through selected combinations of transistors 40, 42, 44, 46 and 48 of DAC 26. It is therefore seen that the biasing current to one shots 10 and 12 is provided by the totality of transistors 40, 42, 44, 46 and 48, operating in a digital mode, in addition to transistor 18, operated in its analog region. The relative current-carrying capacity of transistors 18, 40, 42, 44, 46 and 48 is discussed below in relation to FIG. 4.

In the present example, the inclusion of divider 28 ensures that conducting states of the transistors of current-mode DAC 26 may be changed no more often than once every 1,024 transitions of the input signal. This limitation relates to the time constant of low pass filter 16, and allows the effect of current switching by DAC 26 to propagate through one shots 10 and 12, OR gate 14, filter 16 and analog bias transistor 18 before enabling a subsequent change in the conduction states of digital bias transistors 40, 42, 44, 46 and 48.

In the present example, the circuitry of the frequency doubler operates at a nominal supply voltage of +5 volts. Here, $V_{REF(H)}$ has been selected as 3.8 volts and $V_{REF(L)}$ has been selected as 1.2 volts, allowing analog bias transistor 18 to provide the entire duty cycle regulation while the average output voltage is within that range. This operating range represents approximately one-half of the supply voltage range, but is correspondingly reduced when the supply voltage drops.

Figure 2:
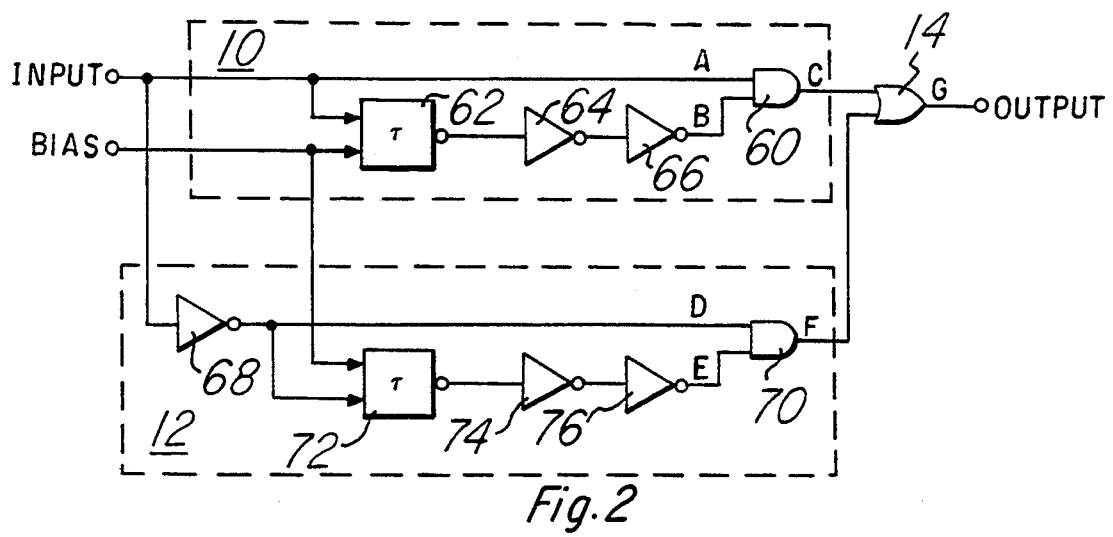
FIG. 2 illustrates in greater detail the one shot circuitry of the frequency doubler of FIG. 1.

Referring now to FIG. 2, there is shown in greater detail the one shot circuitry of the frequency doubler of FIG. 1. The positive-going edge detecting one shot 10 of FIG. 1 encompasses AND gate 60, delay element 62, and buffer/inverters 64 and 66 of FIG. 2; the negative-going edge detecting one shot 12 of FIG. 1 encompasses inverter 68, AND gate 70, delay element 72, and buffer/inverters 74 and 76 of FIG. 2. Devices 62 and 72 are variable delay elements, illustratively current-starved inverters, whose switching times are slowed by limiting the current through them. Because of the odd number of inverting devices in the path comprising elements 62, 64 and 66, the inputs of AND gate 60, (A) and (B), are both high only during the delay period following a low-to-high transition of the input signal. Similarly, because of the odd number of inverting devices in the path comprising elements 72, 74 and 76, the inputs of AND gate 62, (D) and (E), are both high only during the delay period following a high-to-low transition of the input signal.

Figure 3:
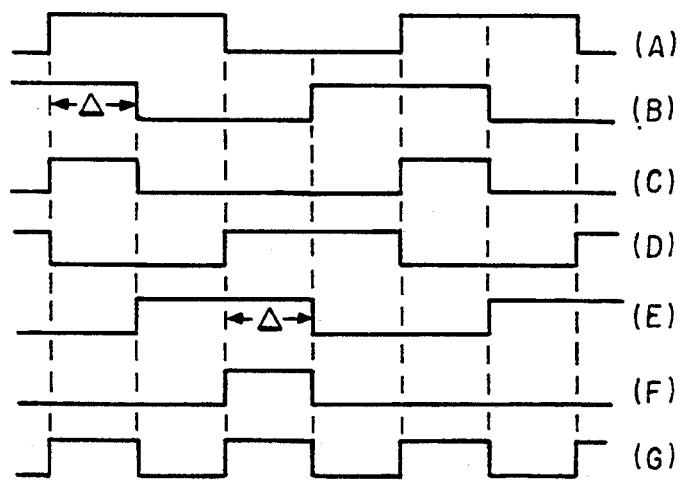
FIG. 3 is a timing diagram useful in understanding the one shot circuitry of FIG. 2.

Operation of the one shot circuitry of FIG. 2 may be better understood from the timing diagram of FIG. 3. This timing diagram includes seven waveforms (A) through (G) which correspond to the signal levels at the seven signal paths denoted (A) through (G) in FIG. 2. From top to bottom, waveform (A) represents the input signal waveform; waveform (B) depicts the input signal of (A) delayed by an amount Δ, representing the delay through elements 62, 64 and 66; and waveform (C) is the result of ANDing waveforms (A) and (B). Waveform (D) represents the input signal waveform inverted by inverter 68; waveform (E) depicts the inverted input signal of (D) delayed by an amount Δ, representing the delay through elements 72, 74 and 76; and waveform (F) is the result of ANDing waveforms (D) and (E). Finally, waveform (G) illustrates the ORing of waveforms (C) and (F), representing the doubled frequency of the input signal.

It will be observed that the leading edges of waveform (G) result from fixed delay path lengths through the portion of the frequency doubler illustrated in FIG. 2, unlike the trailing edges which result from paths which include variable delay elements 62 and 72. Hence, so long as all critical clocking is done on these leading edges of the resulting waveform (G) of doubled frequency, there will be no uncertainty as to the regularity of their occurrences.

Figure 4:
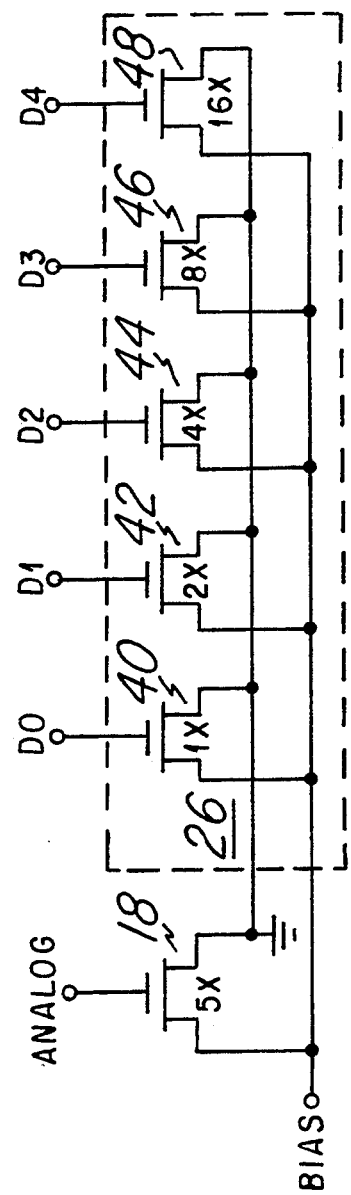
FIG. 4 illustrates the bias current sources of the frequency doubler of FIG. 1.

Referring now to FIG. 4, there is shown the bias current sources of the frequency doubler of FIG. 1. Transistor 18 functions as the analog bias current source, and transistors 40, 42, 44, 46 and 48, comprising the current mode digital-to-analog converter 26, function as the digital bias current sources. The nomenclature at each transistor illustrated in FIG. 4 represents the relative channel width of the corresponding FET.

That is, the five digital FET's 40, 42, 44, 46 and 48 are scaled in a binary relation to one another, so that a range of 32 equal current levels in current mode DAC 26 can be achieved. An important design consideration is ensuring that the operating range within each digital code overlaps enough to allow the circuit to stabilize with some noise margin on the input signal. That is, the circuit cannot be allowed to toggle back and forth between digital codes because the high bias point of one code is only slightly above the low bias point of the adjacent code. Accordingly, the channel width of analog bias transistor 18 is substantially greater than the channel width of the unit digital bias transistor 40. In the illustrative example of FIG. 4, the scaling ratios of these two transistors is 5:1, thereby ensuring that an adjustment in current-mode DAC 26 by one unit of bias current maintains the bias operating point well within the range of regulation of analog bias transistor 18.

The frequency doubler including the current mode DAC as illustrated in FIG. 1 and as described above, overcomes certain limitations of prior art approaches by providing the range of biasing which is required to operate the frequency doubler under all possible conditions. Hence, for the wide range of operating, environmental and process variations envisioned for the application of such frequency doubler, the approach in accordance with the present invention provides a significant advantage.

While the principles of the present invention have been demonstrated with particular regard to the structure disclosed herein, it will be recognized that various departures may be undertaken in the practice of the invention. As an example, whereas the specific embodiment disclosed herein relates to one shot circuitry which is responsive to the magnitude of bias currents for regulating its output pulse width, it will be recognized by those skilled in the art that obvious modifications, e.g., voltage summing amplifiers, may be necessitated for applications where the one shot circuitry is responsive to bias voltages for regulating its output pulse width. The scope of the invention is not intended to be limited to the particular structure disclosed herein, but should instead be gauged by the breadth of the claims which follow.

What is claimed is:

1. In a frequency doubler including means responsive to an input signal for generating an output signal having a single pulse corresponding to each transition of said input signal, wherein the width of said pulse is determined by the magnitude of a bias current supplied to said generating means, and further including means responsive to the average voltage level of said output signal for supplying said bias current, apparatus for adaptively supplementing the range of said bias current to said generating means comprising:
   first means for comparing the average voltage level of said output signal with a first reference voltage level;
   second means for comparing the average voltage level of said output signal with a second reference voltage level, greater than said first reference voltage level;
   a digital up/down counter providing signals representing the count of said counter, said counter signals being in a binary relationship to one another, said counter being responsive to said first comparing means for enabling up counts, and responsive to said second comparing means for enabling down counts; and
   a plurality of switching transistors responsive at their respective gate electrodes to said counter signals, said switching transistors providing bias currents to said generating means in proportion to the count of said counter.

2. The apparatus in accordance with claim 1 wherein said switching transistors comprise field effect transistors (FET's) having channel widths which are scaled in accordance with the binary weighting of their corresponding counter signals.

3. The apparatus in accordance with claim 2 wherein said means for supplying bias current to said generating means comprises an FET having a channel substantially wider than the smallest channel of said FET's comprising said plurality of switching transistors.

4. Apparatus comprising:
   means responsive to an input signal for generating an output signal having a single pulse corresponding to each transistor of said input signal, wherein the width of said pulse is determined by the magnitude of a bias current supplied to said generating means, said generating means including
      a first one shot circuit responsive to a low-to-high transition of said input signal for producing a signal having a single pulse corresponding to each such transition of said input signal,
      a second one shot circuit responsive to a high-to-low transition of said input signal for producing a signal having a single pulse corresponding to each such transition of said input signal, and
      means for combining the signals produced by said first and second one shot circuits to thereby provide an output signal having frequency which is twice the frequency of said input signal;
   means responsive to the average voltage level of said output signal for supplying said bias current;
   means for detecting when said average voltage level is outside of a predetermined voltage range; and
   means responsive to said detecting means for supplementing the bias current provided by said supplying means.

5. The apparatus in accordance with claim 4 wherein said means for supplying said bias current comprises a low-pass filter coupled to said output signal for producing a signal which is a measure of the average voltage level of said output signal.

6. The apparatus in accordance with claim 5 wherein said means for supplying said bias current further comprises a voltage-to-current converter.

7. The apparatus in accordance with claim 6 wherein said voltage-to-current converter comprises a field effect transistor (FET).

8. The apparatus in accordance with claim 4 wherein said detecting means comprises:
   first means for comparing said average voltage level of said output signal with a first reference voltage level; and
   second means for comparing said average voltage level of said output signal with a second reference voltage level, greater than said first reference voltage level.

9. The apparatus in accordance with claim 8 wherein said means for supplementing the bias current provided by said supplying means comprises:
   a digital up/down counter providing signals representing the count of said counter, said counter signals being in a binary relationship to one another, said counter being responsive to said first comparing means for enabling up-counting, and responsive to said second comparing means for enabling down-counting; and a plurality of switching transistors responsive at their respective gate electrodes to said counter signals, said switching transistors providing bias currents to said generating means in proportion to the count of said counter.

10. The apparatus in accordance with claim 9 wherein said switching transistors comprise FET's having channel widths which are scaled in accordance with the binary weighting of their corresponding counter signals.

11. The apparatus in accordance with claim 10 wherein said means for supplying said bias current to said generating means comprises an FET having a channel substantially wider than the smallest channel of said FET's comprising said means for supplementing the bias current.

12. A frequency doubler comprising:

a first one shot circuit responsive to a low-to-high transition of an input signal for generating a signal having a single pulse corresponding to each such transition of said input signal;

a second one shot circuit responsive to a high-to-low transition of said input signal for generating a signal having a single pulse corresponding to each such transition of said input signal, wherein the widths of said pulses are determined by the magnitude of a bias current supplied to said first and second one shot circuits;

means for combining the signals generated by said first and second one shot circuits to thereby provide an output signal having frequency which is twice the frequency of said input signal;

a low-pass filter coupled to said output signal for producing a signal which is a measure of the average voltage level of said output signal;

means responsive to the average voltage level of said output signal for supplying said bias current;

means for detecting when said average voltage level is not within a predetermined voltage range;

a digital counter responsive to said detecting means for providing output signals representing the count of said counter, said counter signals being in a binary relationship to one another; and means responsive to said binary-related output signals for providing supplemental bias currents to said one shots in proportion to the count of said counter.

13. The frequency doubler in accordance with claim 12 wherein said detecting means comprises:

first means for comparing said average voltage level of said output signal with a first reference voltage level; and second means for comparing said average voltage level of said output signal with a second reference voltage level, greater than said first reference voltage level.

14. The frequency doubler in accordance with claim 13 wherein said digital counter is an up/down counter responsive to said first comparing means for enabling up-counting, and responsive to said second comparing means for enabling down-counting.

15. The frequency doubler in accordance with claim 12 wherein said means for providing supplemental bias currents comprises a plurality of switching transistors responsive at their respective gate electrodes to the output signals of said digital counter.

16. The frequency doubler in accordance with claim 15 wherein said switching transistors comprise field effect transistors (FET's).

17. The frequency doubler in accordance with claim 16 wherein the channel widths of said FET's are scaled in accordance with the binary weighting of their corresponding counter signals.

18. The frequency doubler in accordance with claim 17 wherein said means for supplying bias current comprises an FET.

19. The frequency doubler in accordance with claim 18 wherein the channel of said FET of said means for supplying bias current is substantially wider than the smallest channel of said FET's comprising said means for providing supplemental bias current.

* * * * *